United States Patent
Durec et al.

[11] Patent Number: 6,100,763
[45] Date of Patent: Aug. 8, 2000

[54] CIRCUIT FOR RF BUFFER AND METHOD OF OPERATION

[75] Inventors: Jeffery C. Durec; David K. Lovelace, both of Chandler; W. Eric Main, Mesa, all of Ariz.

[73] Assignee: Motorola, Inc., Schaumburg, Ill.

[21] Appl. No.: 09/280,600

[22] Filed: Mar. 29, 1999

[51] Int. Cl.[7] .................................................. H03F 3/26
[52] U.S. Cl. ............................................ 330/267; 330/268
[58] Field of Search ...................................... 330/267, 268, 330/273, 274

[56] References Cited

U.S. PATENT DOCUMENTS

| | | | |
|---|---|---|---|
| 3,772,606 | 11/1973 | Waehner | 330/13 |
| 4,458,213 | 7/1984 | Quan | 330/267 |
| 5,467,058 | 11/1995 | Fujita | 330/267 |
| 5,497,123 | 3/1996 | Main et al. | 330/257 |
| 5,973,563 | 10/1999 | Seven | 330/265 |

*Primary Examiner*—Robert Pascal
*Assistant Examiner*—Henry Choe
*Attorney, Agent, or Firm*—Lanny L. Parker

[57] ABSTRACT

An RF buffer (10) supplies a single ended output signal and differential output signals. An average voltage of the differential output signals is compared to a reference voltage (VR) by an amplifier (40). The amplifier (40) provides a feedback signal for controlling the bias current conducted by a first transistor (24) and a mirrored bias current conducted by a second transistor (46). The bias currents conducted by the first and second transistors (24, 46) are used to generate the differential output signals (OUT−, OUT+) and are substantially independent of the signal level at an input terminal (20). The signal current conducted by the first transistor (24) controls an output transistor (66), while the signal current conducted by the second transistor (46) controls another output transistor (56) in the push-pull output stage of the RF buffer (10).

18 Claims, 1 Drawing Sheet

CIRCUIT FOR RF BUFFER AND METHOD OF OPERATION

BACKGROUND OF THE INVENTION

The present invention relates, in general, to analog amplifiers and, more particularly, to Radio Frequency (RF) analog buffers.

Receiver circuits are used in a myriad of wireless communication applications such as cordless telephones, pagers, and cellular telephones. A receiver circuit typically receives a Radio Frequency (RF) modulated signal from an antenna. The receiver includes an input low-noise amplifier followed by a filter and a mixer. The RF signals are transmitted at a high frequency and are received by the mixer. The mixer uses a local oscillator signal for downconverting the RF signal to an IF signal for additional processing. It is desirable to maintain the receiver sensitivity, linearity, and noise figure over a wide range of input signal levels and input frequencies.

The RF buffer can be used to provide amplification of the local oscillator signal that is used by the mixer for downconverting the RF signal. Another application for the RF buffer includes buffering a signal for transmission by the transmitter section. The RF buffer is the interface block that provides amplification of the signal generated by the voltage controlled oscillator before being passed to the scaler in a phase lock loop circuit.

RF buffers have been implemented using external transistors, inductors, and capacitors, but the external components take up board space and provide a higher cost solution. The tolerance of the external components used in the manufacture of the prior art RF buffers cause performance problems and fluctuations from one part to another.

Hence, a need exists for an RF buffer that has a wide band of frequency operation, and maintains a constant power level when the power level of the input signal is changing. It would be of further advantage for the RF buffer to be fully integrated and have reduced costs.

DETAILED DESCRIPTION OF THE PREFERRED EMBODIMENT

Figure 1:
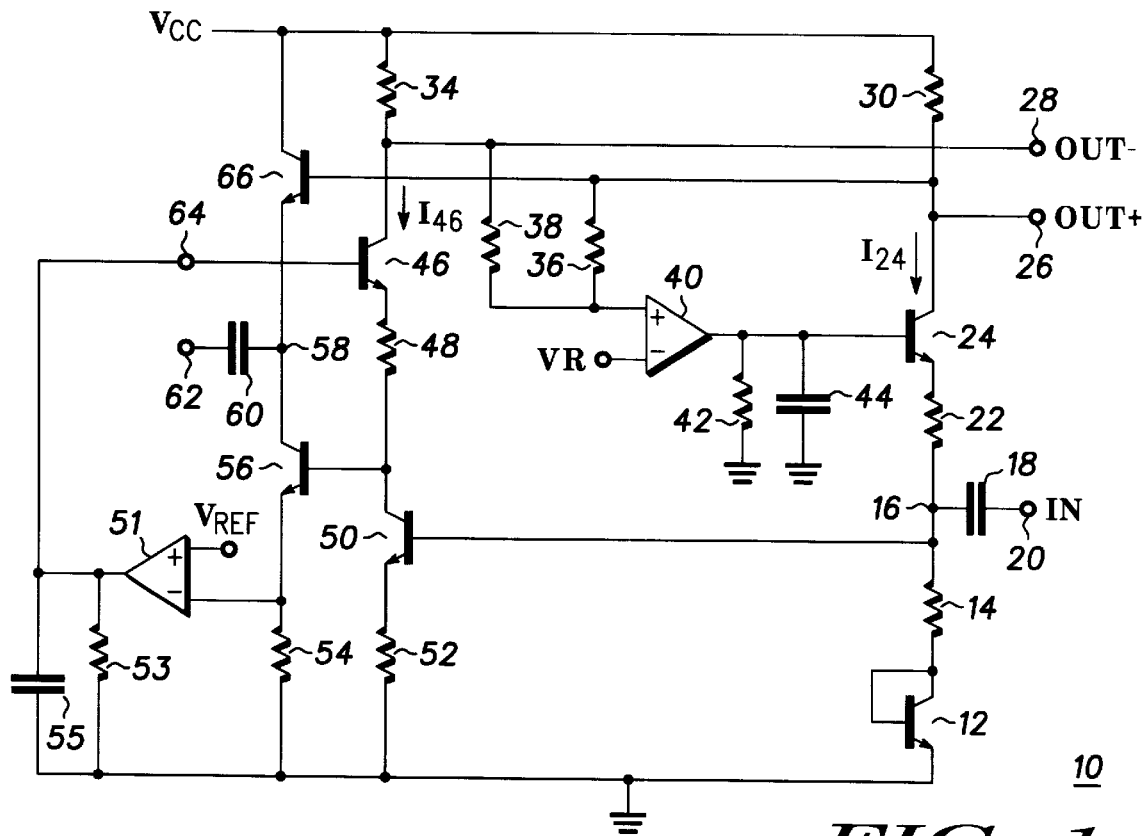
FIG. 1 is a schematic diagram showing the configuration of a single ended or differential output RF buffer.

FIG. 1 is a schematic diagram showing the configuration of a single ended or differential Radio Frequency (RF) output buffer 10. RF buffer 10 has wide band operation, low noise, high gain, and high linearity, and yet, maintains low current consumption as a buffer for dual-band RF applications. RF buffer 10 has applications in a receiver for providing amplification of the local oscillator signal that is used by the mixer for downconverting the RF signal or buffering the local oscillator signal before passing the signal to the pre-scaler in a phase lock loop circuit. A signal generated by a Voltage Controlled Oscillator (VCO) has an output stage that changes significantly in power due to variations in operating voltage and temperature. RE buffer 10 provides bias currents in generating an output signal that are substantially independent of the input signal level.

Transistor 12 has commonly connected base and collector terminals, and an emitter terminal connected to a second power conductor for receiving a bias voltage such as ground. A resistor 14 has a first terminal connected to the common base-collector terminals of transistor 12 and a second terminal connected to a node 16. Resistor 14 has a resistance value of about sixty ohms. Node 16 is coupled through a capacitor 18 to a terminal 20 that receives the signal IN. A transistor 24 has an emitter terminal connected to node 16 through resistor 22, having a resistance value of about sixty ohms. The collector terminal of transistor 24 is connected to a terminal 26 for supplying the signal OUT+. The collector terminal of transistor 24 is further coupled to a second power conductor through a resistor 30, having a resistance value of about one hundred ohms. The second power conductor receives a bias voltage VCC of about three volts.

A transistor 46 has a collector terminal coupled to the second power conductor through a resistor 34, having a resistance value of about one hundred ohms. The collector terminal of transistor 46 is connected to a terminal 28 for supplying the signal OUT−. A base terminal of transistor 46 is connected to a terminal 64 for receiving a bias voltage ranging from about 1.5 to 1.8 volts. An emitter terminal of transistor 46 is coupled to the collector terminal of a transistor 50 through a resistor 48, having a resistance value of about thirty-nine ohms. The base terminal of transistor 50 is connected to node 16 and the emitter terminal is coupled to the first power conductor through a resistor 52, having a resistance value of about sixty ohms.

Transistors 56 and 66 form a push-pull output stage. The collector terminal of transistor 66 is connected to the second power conductor. The base terminal of transistor 66 is connected to the collector terminal of transistor 24. The emitter terminal of transistor 66 is connected to the collector terminal of transistor 56 at node 58. A capacitor 60 couples node 58 to terminal 62. The base terminal of transistor 56 is connected to the collector terminal of transistor 50. The emitter terminal of transistor 56 is coupled to the first power conductor through a resistor 54, having a resistance value of about twenty ohms.

An amplifier 40 has a noninverting input and an inverting input. Resistors 36 and 38 are connected in series between the terminals 26 and 28. The noninverting input of amplifier 40 is common to the terminals that connect resistor 36 with resistor 38. The inverting input of amplifier 40 is coupled for receiving a reference voltage VR, having a value of about 0.1 volts below VCC. The output of amplifier 40 is connected to the base terminal of transistor 24. By way of example, amplifier 40 is a transconductance amplifier having a resistor 42 and a capacitor 44 coupled from the output to a power conductor ground.

It should be noted that resistors 30 and 34 are output load devices of RF buffer 10. Other output load devices such as bipolar transistor loads, MOSFET loads, inductors, diodes, or other devices could serve to generate the differential output signal.

Alternatively, an amplifier 51 could generate the voltage that is supplied at terminal 64. Amplifier 51 has a noninverting input coupled for receiving another reference voltage and an inverting input coupled to the emitter terminal of transistor 56. A capacitor 55 and a resistor 53 are connected in parallel to each other and couple the output signal generated by amplifier 51 to ground.

In operation, RF buffer 10 receives an input signal and supplies a single ended output signal at terminal 62 and differential output signals at terminals 26 and 28. RF buffer 10 uses feedback circuitry, i.e., resistors 36 and 38 and amplifier 40, to generate the output signal and provide bias currents $I_{24}$ and $I_{46}$ that are substantially independent of the input signal level at terminal 20. The current $I_{24}$ is the collector current conducted by transistor 24 and the current $I_{46}$ is the collector current conducted by transistor 46. The currents $I_{24}$ and $I_{46}$ represent both a bias current and a signal current. Although the signal current portions of $I_{24}$ and $I_{46}$ vary, the bias current portions substantially match each other. The feedback circuitry ensures that the bias currents $I_{24}$ and $I_{46}$ have current values that are set by the reference voltage VR. The currents $I_{24}$ and $I_{46}$ have current values determined by the reference voltage VR divided by the resistance value of resistor 30 (or resistor 34 since the load resistors 30 and 34 have resistance values that are the same).

An increasing input signal voltage at terminal 20 causes the base-emitter voltage of transistor 24 to decrease and the signal current $I_{24}$ to decrease. The increasing voltage at terminal 20 also causes the base-emitter voltage of transistor 12 to increase and the signal current conducted by transistor 12 to increase. The combination of transistor 12 and resistor 14 are configured, along with the combination of transistor 50 and resistor 52, to form a current mirror. Thus, when the current in transistor 12 increases, the current conducted by transistor 50 increases proportionately based on the ratio of the emitter areas of transistors 12 and 50. Current $I_{50}$ conducted by transistor 50 is cascoded through transistor 46 and resistor 48. The current $I_{46}$ conducted by transistor 46 increases when the current conducted by transistor 50 increases. Thus, an increase in voltage at terminal 20 causes the signal current $I_{24}$ to decrease and the signal current $I_{46}$ to increase.

The decreasing signal current $I_{24}$ causes a smaller voltage to be dropped across resistor 30 and consequently, the voltage at terminal 26 is increased. Further, the increasing signal current $I_{46}$ causes a larger voltage to be dropped across resistor 34 and the voltage at terminal 28 is decreased. The voltages at terminals 26 and 28 vary equally in amplitude, but opposite in phase. Thus, an increasing voltage at terminal 20 generates balanced differential output signals OUT+ and OUT− at respective terminals 26 and 28.

The single-ended output signal at terminal 62 is generated by push-pull transistors 56 and 66. When the voltage at terminal 26 is increasing, the base-to-emitter voltage of transistor 66 is increasing. Transistor 66 is an emitter follower that causes the voltage at terminal 62 to increase. Transistor 50 is a portion of an inverting amplifier that has a lower collector voltage when the voltage at terminal 20 is increased. The lower collector voltage of transistor 50 lowers the base-emitter voltage of transistor 56 and decreases the conduction current of transistor 56. An increasing voltage at terminal 20 causes transistor 66 to conduct a higher current and transistor 56 to conduct a lower current. Thus, the voltage at the base terminals of push-pull transistors 56 and 66 move in opposite directions in response to a voltage change at terminal 20. The signal currents conducted by the push-pull transistors 56 and 66 are in phase and increase the voltage swing of the output signal at terminal 62.

One feature of the present invention includes controlling the bias currents $I_{24}$ and $I_{46}$ that are conducted by respective transistors 24 and 46 to be substantially independent from a signal at terminal 20. Amplifier 40 is a feedback circuit that uses resistors 36 and 38 to provide the average of the voltages supplied at terminals 26 and 28. As the peak-to-peak signal at terminal 20 increases, the single ended RF buffer 10 operates as a Class AB amplifier. In Class AB operation, the average bias currents $I_{24}$ and $I_{46}$ are increased, causing the average voltage of the signals OUT− and OUT+ at terminals 26 and 28 to decrease.

The average voltage of the signals OUT− and OUT+ is supplied to the noninverting terminal of amplifier 40 and compared against the reference voltage VR supplied at the inverting terminal. When the average voltage at the noninverting terminal is lower than the reference voltage VR, amplifier 40 generates a lower output voltage at the base terminal of transistor 24. The bias current $I_{24}$ conducted by transistor 24 and the mirrored bias current $I_{46}$ conducted by transistor 46 are both reduced by the lower output voltage from amplifier 40. With bias currents $I_{24}$ and $I_{46}$ reduced, the voltage level of signals OUT− and OUT+ increase to the point that the average of the voltages OUT− and OUT+ is about equal to the reference voltage VR. Thus, amplifier 40 functions to control the bias currents $I_{24}$ and $I_{46}$ that are conducted by respective transistors 24 and 46 to be substantially independent from the input signal at terminal 20.

On the other hand, when the average voltage at the noninverting terminal is higher than the reference voltage VR, amplifier 40 generates a higher output voltage at the base terminal of transistor 24. The bias current $I_{24}$ conducted by transistor 24 and the mirrored bias current $I_{46}$ conducted by transistor 46 are both increased by the higher output voltage from amplifier 40. With bias currents $I_{24}$ and $I_{46}$ increased, the voltage level of signals OUT− and OUT+ decrease to the point that the average of the voltages OUT− and OUT+ is about equal to the reference voltage VR. Again, amplifier 40 functions to control the bias currents $I_{24}$ and $I_{46}$ that are conducted by respective transistors 24 and 46 to be substantially independent from the input signal at terminal 20.

Figure 2:
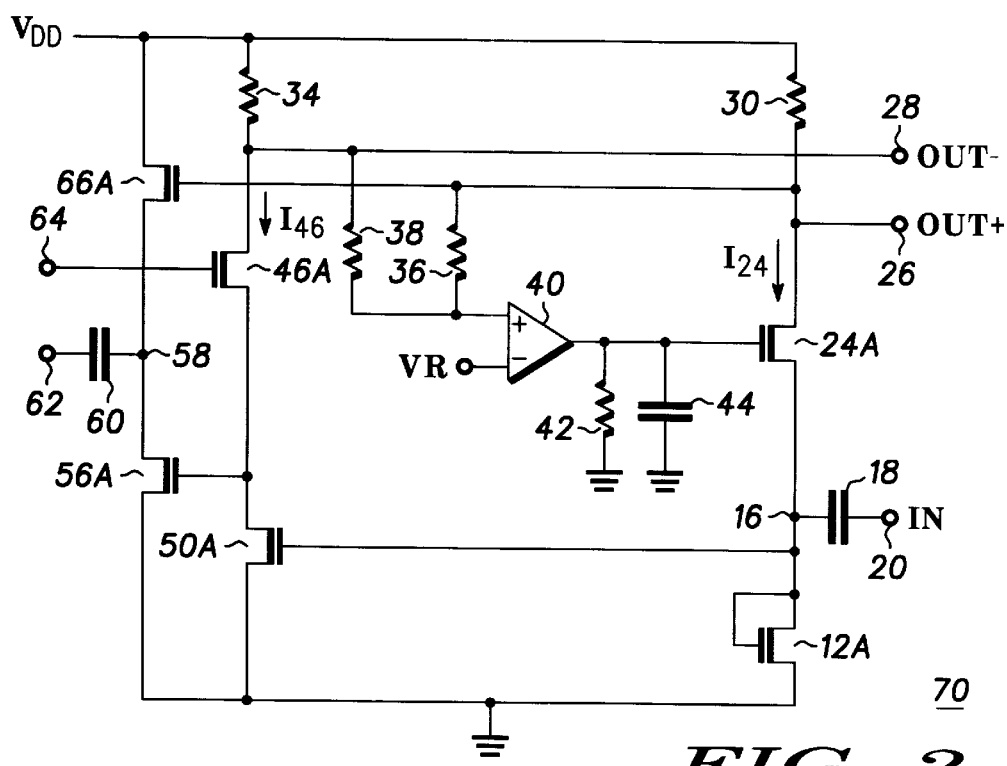
FIG. 2 is a schematic diagram showing the configuration of a single ended or differential output RF buffer using MOSFETs.

FIG. 2 is a schematic diagram showing the configuration of RF buffer 70 using MOSFETs in generating a single ended or differential output. It should be pointed out that the same reference numbers are used in the figures to denote the same elements. The letter A has been appended to the reference numbers of the transistors to indicate that the transistors are MOSFET devices. In this embodiment, the bipolar transistors shown in FIG. 1 have been replaced by Metal Oxide Semiconductor Field Effect Transistors (MOSFETs). In the replacement process, the interconnect shown in FIG. 1 to the base terminals, collector terminals, and emitter terminals of the bipolar transistors corresponds to the interconnect shown in FIG. 2 to the gate terminals, drain terminals, and source terminals, respectively, of the N-channel MOSFETs.

The operation of RF buffer 70 is similar to the operation of RF buffer 10. RF buffer 70 receives an input signal at terminal 20 and supplies a single ended output signal at terminal 62 and differential output signals at terminals 26 and 28. RF buffer 10 uses feedback circuitry, i.e., resistors 36 and 38 and amplifier 40, to provide bias currents in generating an output signal that are substantially independent of the input signal level. The current $I_{24}$ is the drain current conducted by transistor 24A and the current $I_{46}$ is the drain current conducted by transistor 46A.

By now it should be appreciated that an RF buffer has been provided that has a wide band of frequency operation and maintains a constant power level when the power level of the input signal is changing. The RF buffer is fully integrated, does not require external components, and has reduced manufacturing costs.

What is claimed is:

1. A Radio Frequency (RF) circuit, comprising:

first and second loads coupled between a first power conductor and respective first and second output terminals;

a first amplifier having a first input coupled to the first and second output terminals for receiving an average value of voltages that are generated across the first and second loads, and a second input coupled for receiving a reference voltage; and a first transistor having a control terminal coupled to an output of the first amplifier, a first conduction terminal coupled to the first output terminal, and a second conduction terminal coupled to a second power conductor, where the first transistor controls a bias current in the first load based on the reference voltage.

2. The RF circuit of claim 1, further comprising a second transistor having a control terminal coupled to the second conduction terminal of the first transistor, a first conduction terminal coupled to the second power conductor, and a second conduction terminal coupled to the second output terminal.

3. The RF circuit of claim 1, wherein the first and second loads are resistors.

4. The RF circuit of claim 1, further comprising a third transistor having a control terminal and a first conduction terminal commonly coupled to the control terminal of the second transistor, and a second conduction terminal coupled to the second power conductor.

5. The RF circuit of claim 1, further comprising:

a first resistor having a terminal coupled to the first output terminal and a second terminal coupled to the first input of the first amplifier; and a second resistor having a terminal coupled to the second output terminal and a second terminal coupled to the first input of the first amplifier.

6. The RF circuit of claim 5, wherein the first and second resistors have a same resistance value for providing the average value of the voltages at the first input of the first amplifier.

7. The RF circuit of claim 1, further comprising a push-pull output driver, wherein the push-pull output driver includes:

a first output transistor having a control terminal coupled to the first output terminal, a first conduction terminal coupled to the first power conductor, and a second conduction terminal coupled to a third output terminal of the RF buffer; and a second output transistor having a control terminal coupled to the second conduction terminal of the second transistor, a first conduction terminal coupled to the second power conductor, and a second conduction terminal coupled to the third output terminal of the RF buffer.

8. The RF circuit of claim 7, further comprising a second amplifier having a first input coupled for receiving a voltage value and a second input coupled to the first conduction terminal of the second output transistor.

9. The RF circuit of claim 8, further comprising a fourth transistor having a control terminal coupled to an output terminal of the second amplifier, a first conduction terminal coupled to the second output terminal, and a second conduction terminal coupled to the second conduction terminal of the second transistor.

10. An RF buffer having an input terminal and first and second output terminals, comprising:

a first transistor having a control terminal and a first conduction terminal coupled to the input terminal and a second conduction terminal coupled to a first power conductor;

a second transistor having a control terminal coupled to the input terminal, a first conduction terminal coupled to the first power conductor, and a second conduction terminal coupled to the first output terminal;

an amplifier having a first input coupled to the first and second output terminals and a second input coupled for receiving a reference voltage; and a third transistor having a control terminal coupled to an output of the amplifier, a first conduction terminal coupled to the second output terminal, and a second conduction terminal coupled to the input terminal.

11. The RF buffer of claim 10, further comprising:

a first resistor coupled between the first output terminal and the first input of the amplifier; and a second resistor coupled between the second output terminal and the first input of the amplifier.

12. The RF buffer of claim 10, further comprising a first output transistor having a control terminal coupled to the second output terminal, a first conduction terminal coupled to a second power conductor, and a second conduction terminal coupled to a third output terminal.

13. The RF buffer of claim 12, further comprising a second output transistor having a control terminal coupled to the second conduction terminal of the second transistor, a first conduction terminal coupled to the first power conductor, and a second conduction terminal coupled to the third output terminal.

14. The RF buffer of claim 13, further comprising a load coupled between the first and second output terminals.

15. A method of operating an RF buffer, comprising the steps of:

generating a differential output signal across first and second loads in response to an input signal;

generating an average value of voltages that are generated across the first and second loads;

adjusting the bias currents through the first and second loads such that the average value of the voltages matches a reference voltage; and matching the bias current conducted through the first load with the bias current conducted through the second load by mirroring the bias current conducted through the first load to a current conducted through the second load.

16. The method of claim 15, further comprising the step of generating a single ended output signal using the bias currents conducted through the first and second loads.

17. The method of claim 15, further comprising the step of generating a bias voltage for controlling the current conducted through the second load from an average current in the output stage that provides the single ended output signal.

18. The method of claim 17, further comprising the step of summing two output currents such that a peak source current substantially matches a peak sink current in the output stage.

* * * * *